United States Patent
Saitou

(10) Patent No.: US 8,022,542 B2
(45) Date of Patent: Sep. 20, 2011

(54) SEMICONDUCTOR DEVICE HAVING IMPROVED METAL WIRING

(75) Inventor: Kazumi Saitou, Tsuruoka (JP)

(73) Assignee: Renesas Electronics Corp, Kanagawa (JP)

( * ) Notice: Subject to any disclaimer, the term of this patent is extended or adjusted under 35 U.S.C. 154(b) by 755 days.

(21) Appl. No.: 11/543,794

(22) Filed: Oct. 6, 2006

(65) Prior Publication Data

US 2007/0080445 A1 Apr. 12, 2007

(30) Foreign Application Priority Data

Oct. 7, 2005 (JP) ................................. 2005-294591

(51) Int. Cl.
*H01L 23/48* (2006.01)

(52) U.S. Cl. . 257/750; 257/763; 257/765; 257/E23.145; 257/E23.163; 257/E21.627

(58) Field of Classification Search .......... 438/584–688; 257/700, E23.145, E23.163, E21.627, E21.641, 257/750, 763, 765

See application file for complete search history.

(56) References Cited

U.S. PATENT DOCUMENTS

| | | | |
|---|---|---|---|
| 6,099,701 A * | 8/2000 | Liu et al. .................. | 204/192.22 |
| 6,383,914 B1 | 5/2002 | Yasuda | |
| 6,686,236 B2 * | 2/2004 | Aggarwal et al. ............. | 438/239 |
| 6,903,398 B2 * | 6/2005 | Yamamoto .................... | 257/295 |
| 7,064,056 B2 * | 6/2006 | Thei et al. ..................... | 438/627 |
| 2002/0098670 A1 * | 7/2002 | Ashihara et al. .............. | 438/586 |
| 2004/0253807 A1 | 12/2004 | Thei et al. | |

FOREIGN PATENT DOCUMENTS

| | | |
|---|---|---|
| CN | 1458689 | 11/2003 |
| JP | 2000-114376 | 4/2000 |
| JP | 2001-176873 | 6/2001 |
| JP | 2004-014763 | 1/2004 |
| JP | 2004-39879 | 2/2004 |
| JP | 2005-057195 | 3/2005 |

OTHER PUBLICATIONS

Official Action dated Jul. 23, 2010 in corresponding Taiwanese application and English translation.
Japanese Official Action—2005-294591—Jan. 11, 2011.

* cited by examiner

*Primary Examiner* — Khiem D Nguyen

(74) *Attorney, Agent, or Firm* — Young & Thompson

(57) ABSTRACT

A semiconductor device includes a semiconductor substrate, an interlayer insulating film, a tungsten film, a first barrier metal film, a second barrier metal film and a metal wiring film. The interlayer insulating film is formed on the semiconductor substrate, and has an opening. The tungsten film is embedded in the opening. The first barrier metal film is formed on the tungsten film and excludes a Ti film. The second barrier metal film is formed on the first barrier metal film and is a Ti-containing film. The metal wiring film is formed on the second barrier metal film.

7 Claims, 5 Drawing Sheets

SEMICONDUCTOR DEVICE HAVING IMPROVED METAL WIRING

BACKGROUND OF THE INVENTION

1. Field of the Invention

The present invention relates to a semiconductor device having a metal wiring.

2. Description of the Related Art

As a conventional method of manufacturing a semiconductor device, there is a method shown in FIGS. 1 and 2.

In this manufacturing method, at first as shown in FIG. 1, an opening 202*a* is formed in an interlayer dielectric film (interlayer insulation film) 202 on a semiconductor substrate 201. A Ti (Titanium) film 204, a TiN (Titanium nitride) film 206 and a W (tungsten)-film are embedded in the opening 202*a*. Then, an etch-back process or a CMP (Chemical Mechanical Polishing) process is carried out, thereby holding those films in the opening 202*a* and forming a W (tungsten) plug 208.

Next, so as to cover the whole of the interlayer dielectric film 202, the Ti film 204, the TiN film 206 and the W-plug 208, a Ti film 210 and a TiN film 212 are formed as a barrier metal. Then, an Al (aluminum) wiring 214, a Ti film 216 and a TiN film 218 are formed in turn on the TiN film 212. Next, as shown in FIG. 2, a dry etching process is carried out, thereby partially removing those films and forming an Al wiring 214. In this way, since the barrier metal is designed so as to have a lamination structure of the Ti film 210 and the TiN film 212, it is possible to improve the migration resistance property of the wiring layer formed on the surface of the TiN film 212 and further improve the adhesive property to the wiring layer.

However, in the foregoing process, when the Al wiring is formed, a damage portion 222 caused by side-etching may be induced in the Ti film 210 that contacted with the W-plug 208. This damage portion 222 results in the increase in a contact resistance between the W-plug 208 and the Ti film 210 so that the electrical connection between them is decreased.

Japanese Laid-open Patent Application JP-P2004-39879A discloses a technique to solve this problem. In the technique, a W-plug is formed in an interlayer dielectric film so that an upper surface of the W-plug is higher than a surface of this interlayer dielectric film. Then, so as to cover the interlayer dielectric film and the W-plug, a Ti film and a TiN film are formed in turn as a barrier metal. Then, only the barrier metal (TiN film/Ti film) on the W-plug is removed by using a CMP process.

Also, Japanese Laid-Open Patent Application JP-P2004-14763A discloses a semiconductor device where a TiN film of a single layer is formed on a surface of a W-plug and a surface of an interlayer dielectric film.

However, we have now discovered that the conventional techniques disclosed in the foregoing applications have room for improvement with regard to the following points.

Firstly, the method in JP-P2004-39879A is required to form the fine W-plug with excellent controllability and further required to remove only the barrier metal formed on the W-plug. For this reason, it is very difficult to obtain the high reproducibility and excellent controllability. Further, there is still a case that the side of the Ti film in contact with the W-plug is etched in an etching process when the Al wiring is formed. Thus, the contact resistance between the W-plug and the Ti film is increased, which decreases the electrical connection. Moreover, a process for removing the barrier metal formed on the W-plug and the like are required, which increases the number of manufacturing processes and the manufacturing costs.

Secondly, in the semiconductor device disclosed in JP-P2004-14763A, the film formation property of the wiring layer formed on the surface of the TiN film is reduced, which may decrease the yield. In particular, in the case that the wiring layer is the Al wiring layer, the reduction in the film formation property is severe.

In this way, in the semiconductor device having the W-film, the semiconductor device is desired of which the simple method can be used to protect the side etching of the barrier metal film and improve the electrical connection between the W-film and the barrier metal film. Moreover, the semiconductor device is desired which can improve the film formation property of the wiring layer.

SUMMARY OF THE INVENTION

In order to achieve an aspect of the present invention, the present invention provides a semiconductor device including: a semiconductor substrate;, an interlayer insulating film configured to be formed on the semiconductor substrate, and have an opening; a tungsten film configured to be embedded in the opening; a first barrier metal film configured to be formed on the tungsten film and exclude a Ti film; a second barrier metal film configured to be formed on the first barrier metal film and be a Ti-containing film; and a metal wiring film configured to be formed on the second barrier metal film.

According to the present invention, the W-film (W-plug) is in contact with the first barrier metal film composed of the film excluding the Ti film. Thus, in the etching process when the metal wiring film is formed, the damage portion caused by the side etching is never generated in the first barrier metal film 110. Consequently, the electrical connection between the W-film (the W-plug) and the first barrier metal film is stabilized which improves the yield of products.

BRIEF DESCRIPTION OF THE DRAWINGS

The above and other objects; advantages and features of the present invention will be more apparent from the following description taken in conjunction with the accompanying drawings, in which.

DESCRIPTION OF THE PREFERRED EMBODIMENTS

The invention will be now described herein with reference to an illustrative embodiment. Those skilled in the art will recognize that many alternative embodiments can be accomplished using the teachings of the present invention and that the invention is not limited to the embodiments illustrated for explanatory purposed.

An embodiment of a semiconductor device according to the present invention will be described below with reference to the attached drawings. Here, in all of the drawings, the similar symbols are given to the similar elements, and their explanations are properly omitted.

Figure 4:
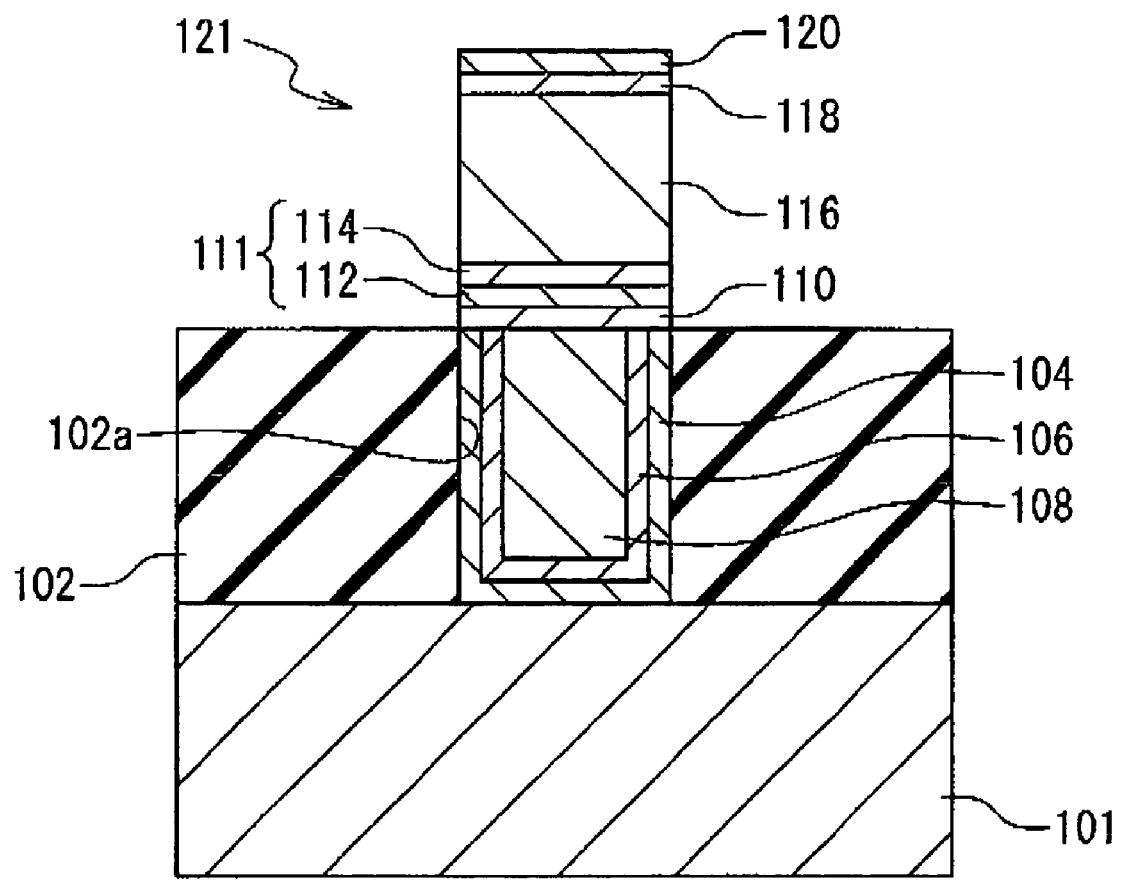

As shown in FIG. 4, the semiconductor device in this embodiment includes a semiconductor substrate 101, an interlayer dielectric film (interlayer insulation film) 102, a W-film (W-plug 108), a first barrier metal film 110, a second barrier metal film 111, and a metal wiring film 116. The interlayer dielectric film 102 is formed on the semiconductor substrate 101, and has an opening 102a. The W-film (W-plug 108) is embedded in the opening 102a. The first barrier metal film 110 is formed on a surface of the W-plug 108. The second barrier metal film 111 is formed on a surface of the first barrier metal film 110. The metal wiring film 116 formed on the surface of the second barrier metal film 111. A Ti film 104 and a TiN film 106 are laminated between the inner wall of the opening 102a and the outer surface of the W-plug 108. Incidentally, a lower-layer wiring (not shown) and/or electrical elements (not shown) may be formed on the surface of the semiconductor substrate 101.

The first barrier metal film 110 is formed on the side in contact with the W-plug 108. The first barrier metal film 110 is a film excluding a Ti film. Preferably, the first barrier metal film is a metal-containing film, which. does not include a Ti film. Transition metal is more preferable as metal in the metal-containing film. A metal nitride film can be used as the first barrier metal film. For example, a TiN film, a WN film, a TaN film and the like can be listed. A film thickness of the first barrier metal film 110 is in the range between approximately 100 nm and 10 nm. This embodiment is explained by using an example in which the first barrier metal film 110 is made of the TiN film.

The second barrier metal film 111 is composed of Ti-containing material and may be, for example, a single layer or multi-layer selected from a Ti film, a TiN film, a TiW-film and the like. The film thickness of the second barrier metal film 111 is between approximately 150 nm and 10 nm. This embodiment is explained by using the lamination film of the second barrier metal film 111 where a Ti film 112 and a TiN film 114 are laminated in turn.

Also, the metal wiring film 116 is composed of the Al film or W-film. In this embodiment, it is formed on the surface of the TiN film 114.

Next, the method of manufacturing the semiconductor device.in this embodiment will be explained below with reference to FIGS. 3 and 4.

At first, the interlayer dielectric film 102 is formed on the semiconductor substrate 101. Next, the opening 102a is formed on a predetermined position of the interlayer dielectric film 102 by using a usual lithography technique. Then, the Ti film 104 and the TiN film 106 are laminated in turn so as to cover the inner wall of this opening 102a and the upper surface of the interlayer dielectric film 102, Moreover, the W-film is formed so as to be embedded in the inner wall of the TiN film 106. These films are formed by using a usual sputtering method or CVD method.

Next, the Ti film 104, the TiN film 106 and the W-film outside the opening 102a are removed by using an etch-back method or a CMP method and the like. Then, these films are held only inside the opening 102a, and the W-plug 108 is formed.

Then, the usual sputtering method or CVD method is used to laminate the first barrier metal film 110, and the Ti film 112 and the TiN film 114 as the second barrier metal film 111, in turn, so as to cover the whole of the interlayer dielectric film 102, the Ti film 104, the TiN film 106 and the W-plug 108.

Figure 1:
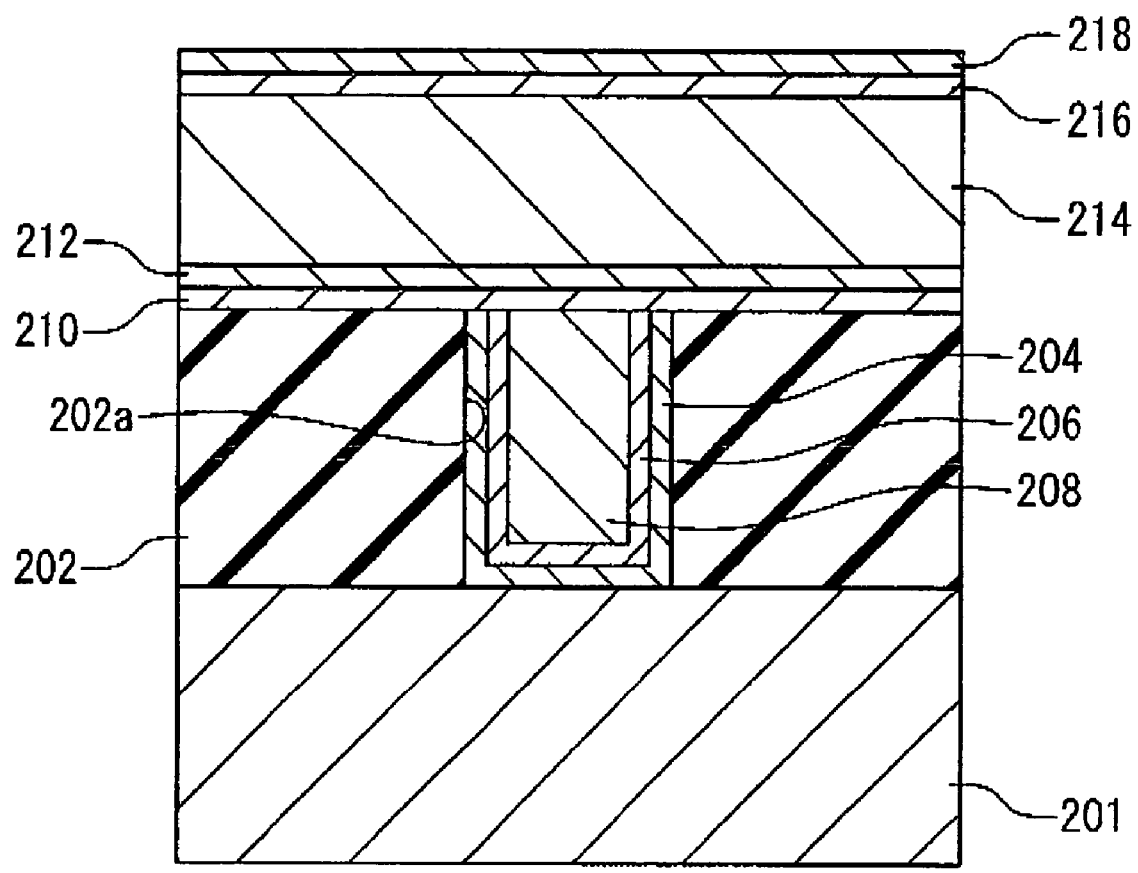
FIGS. 1 and 2 are sectional views diagrammatically showing a conventional method of manufacturing a semiconductor device.
Figure 2:
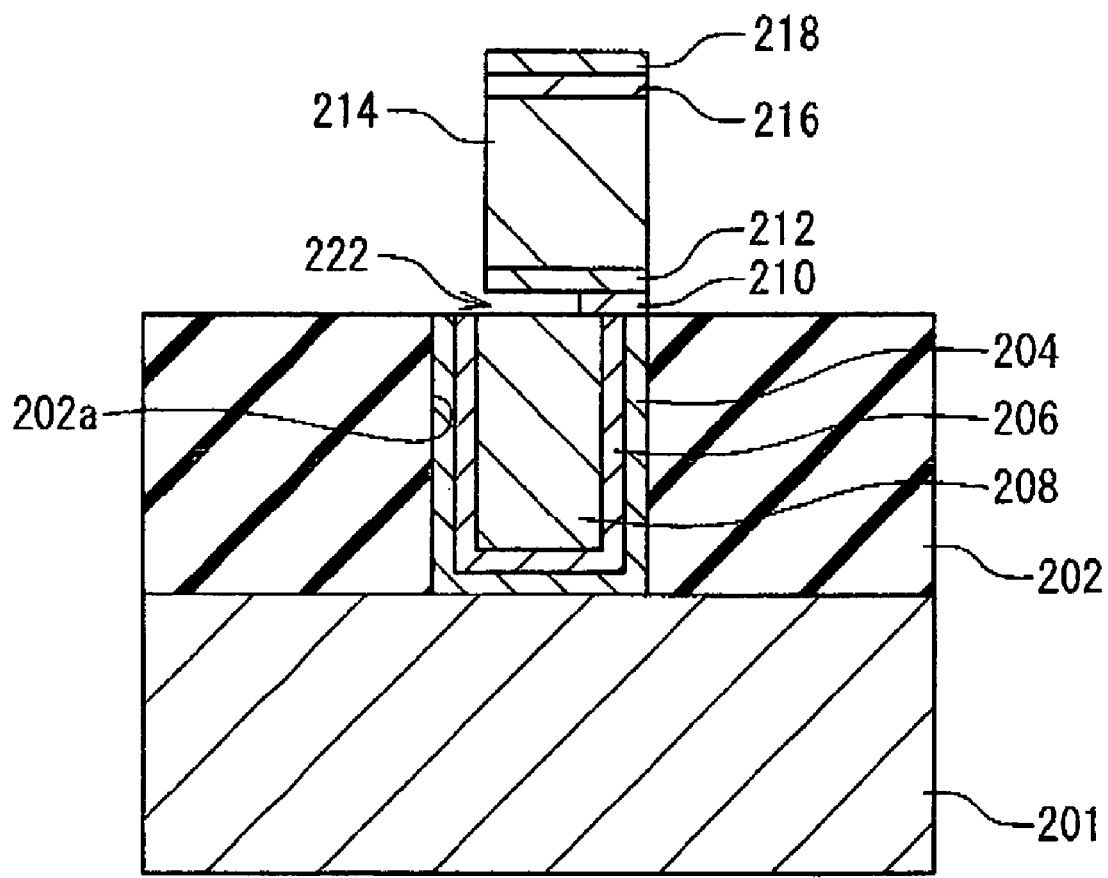
Figure 3:
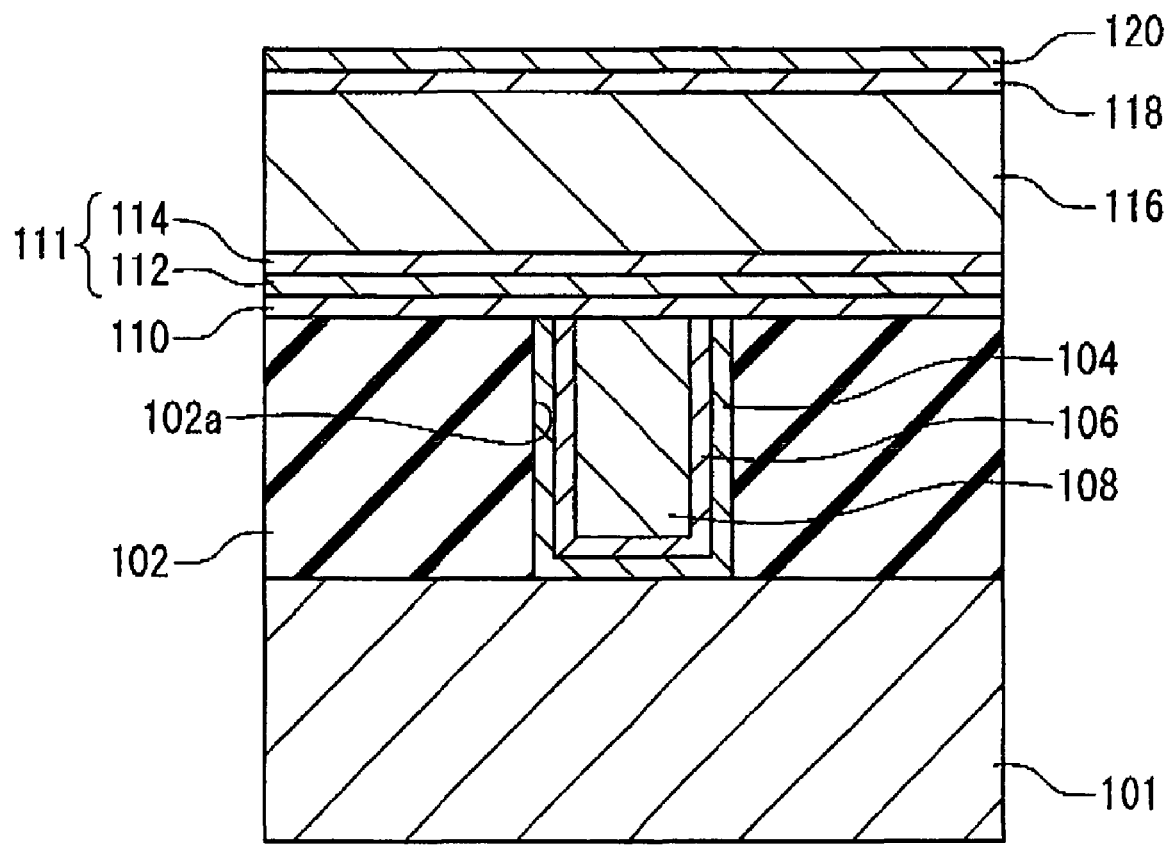
FIGS. 3 and 4 are sectional views diagrammatically showing a method of manufacturing a semiconductor device, according to the present invention.

Then, the metal wiring film 116, a Ti film 118 and a TiN film 120 are formed in turn on the surface of the TiN film 114 as shown in FIG. 3.

Next, a usual dry etching method is used to selectively remove the TiN film 120, the Ti film 118, the metal wiring film 116, the second barrier metal film 111 (the TiN film 114 and the Ti film 112) and the first barrier metal film 110 so as to form the metal wiring (metal wiring layer) 121. In this way, the semiconductor device is formed as shown in FIG. 4.

The effect of this embodiment will be described below.

The semiconductor device in this embodiment has the barrier metal film composed of: the first barrier metal film110 excluding theTi film; and thesecondbarriermetal film 111 that is the Ti-containing film formed on the first barrier metal film 110. Thus, it is possible to stabilize the electrical connection between the W-film (W-plug 108) and the barrier metal film and further improve the film formation property of the wiring layer.

In the semiconductor device of JP-P2004-39879A, the barrier metal layer formed on the surface of the interlayer dielectric film is usually formed in the two-layer structure of the TiN film/Ti film. In this conventional semiconductor device, in the dry etching process for forming the wiring, there is a case that the side of the Ti film in contact with the W-film is etched. In this case, the contact resistance between the W-plug and the Ti film is increased which decreases the electrical connection.

Moreover, in the semiconductor device of JP-P2004-14763A, the wiring layer is formed on the surface of the single-layer TiN film formed on the W-plug surface. In this conventional semiconductor device, the film formation property of the wiring layer is decreased which reduced the yield.

On the contrary, in this embodiment, the W-film (W-plug 108) is in contact with the first barrier metal film 110 composed of the film excluding the Ti film. Thus, in the etching process when the metal wiring film 116 is formed, the damage portion caused by the side etching is never formed in the first barrier metal film 110. Consequently, the electrical connection between the W-film (the W-plug 108) and the first barrier metal film 110 is stabilized which improves the yield of products.

Moreover, the barrier metal film in this embodiment has the lamination structure of: the first barrier metal film 110 excluding the Ti film; andthe secondbarriermetal film ill that is the Ti-containing film. Consequently, it ispossible to remove the influence of the W-film (W-plug 108) and the interlayer dielectric film 102. Moreover, the use of the second barrier metal film 111 that is the Ti-containing film canimprove the film formation property of the wiring layer. Thus, the yield of the semiconductor device products is improved.

Also, the first barrier metal film 110 in this embodiment can be composed of the metal nitride film and can be further composed of the TiN film.

Consequently, at the time of the dry etching process for forming the wiring, the first barrier metal film 110 is suppressed from being side-etched. Thus, the reduction in the electrical connection between the W-plug 208 and the first barrier metal film 110 is especially suppressed.

The second barrier metal film 111 in this embodiment can be provided with the lamination film where the Ti film 112 and the TiN film 114 are laminated in turn.

Consequently, the film formation property of the wiring layer can be further improved, which further improves the yield of the products. Such effect can be preferably obtained when the metal wiring film 116 is used as the Al wiring or W-wiring.

Moreover, in this embodiment, the metal wiring film 116 may be used as the Al wiring. This case especially improves the film formation property of the Al wiring.

The barrier metal layer of the conventional semiconductor device has the two-layer structure where the Ti film 210 and the TiN film 212 are usually laminated in turn. In the case that the Al wiring 214 is formed on this barrier metal layer, there is a case that the film formation property of the Al wiring 214 is reduced. Such trend is. especially severe in the semiconductor device of JP-P2004-14763A.

The reduction in the-film formation property of the Al wiring 214, specifically, the reduction in the migration resistance property caused by the drop in Al orientation property can be listed. The Al orientation property, which influences this migration resistance property, is influenced by the surface situation of the TiN film 212 serving as the base. Moreover, the surface situation of this TiN film 212 is further influenced by the Ti film 210 serving as its base film, the interlayer dielectric film 202 and the W-plug 208. Thus, in the semiconductor device of JP-P2004-14763A where the barrier metal layer is constituted by the single-layer TiN film, the migration resistance property is especially reduced.

On the contrary, according to this embodiment, there is the first barrier metal film 110 between the W-plug 108 and the second barrier metal film 111. Thus, the influence of the W-film (W-plug 108) and the interlayer dielectric film 102 on the Al wiring can be removed, thereby making the Al orientation property excellent, which consequently improves the film formation property of the metal wiring film 116. Hence, the migration resistance property of the metal wiring film 116 is improved, and the stable electrical property is obtained, thereby improving the yield of the products.

Furthermore, in this embodiment, the metal wiring film 116 may be used as the W-wiring. In this case, the film formation property of the W-wiring is especially improved, such as the improvement of the adhesive property between the W-wiring and the second barrier metal film 111.

As mentioned above, the embodiment of the present invention has been described with reference to the drawings. However, this is the exemplification of the present invention, and various configurations other than the above-mentioned configurations may be employed.

Figure 5:
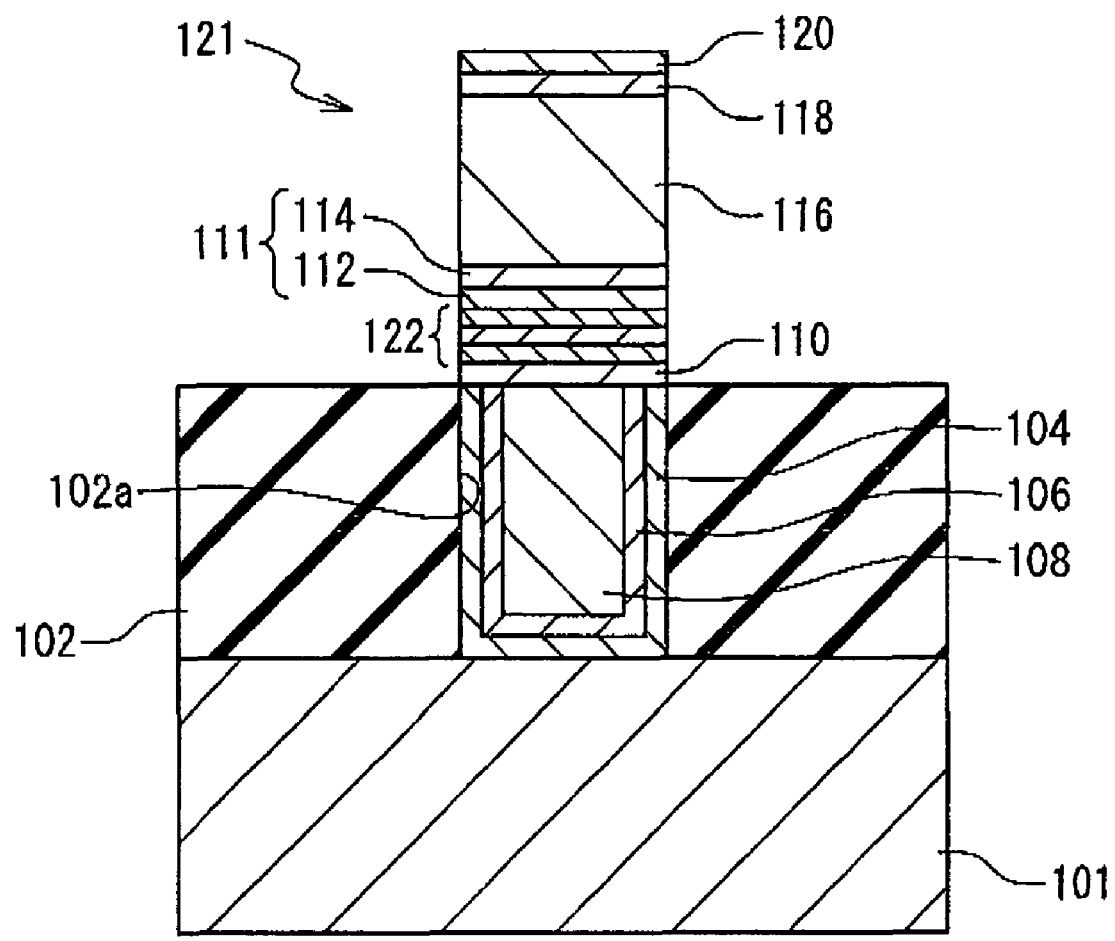
FIG. 5 is a sectional view diagrammatically showing another semiconductor device according to the present invention.

For example, between the first barrier metal film 110 and the second barrier metal film 111, there may be a plurality of different barrier metal films 122 as shown in FIG. 5.

According to the present invention, the semiconductor device is provided in which the simple method can be used to stabilize the electrical connection between the W-film and the barrier metal film, and further improve the film formation property of the wiring layer.

It is apparent that the present invention is not limited to the above embodiment that may be modified and changed without departing from the scope and spirit of the invention.

What is claimed is:

1. A semiconductor device, comprising:
   a semiconductor substrate;
   an interlayer insulating film configured to be formed on said semiconductor substrate, and having an opening;
   a tungsten film configured to be embedded in said opening;
   a barrier metal film configured to be formed contacting said tungsten film, the barrier metal film including a sequentially stacked order of a first metal-nitride film, a second Ti film, a third TiN film, a fourth Ti film, a fifth Ti film, and a sixth TiN film; and
   a metal wiring film configured to be formed contacting said sixth TiN film,
   wherein said second, fourth, and fifth Ti films consist essentially of titanium.

2. The semiconductor device according to claim 1, wherein said metal wiring includes an aluminum wiring.

3. The semiconductor device according to claim 1, wherein said metal wiring includes a tungsten wiring.

4. The semiconductor device according to claim 1, further comprising a laminated Ti/TiN film in said opening.

5. The semiconductor device according to claim 4, wherein said laminated Ti/TiN film is disposed between said tungsten film and sidewalls of said opening.

6. The semiconductor device according to claim 5, wherein said first barrier metal film contacts said laminated Ti/TiN film.

7. The semiconductor device according to claim 1, wherein said metal-nitride film includes one of a TiN film, a WN film, and a TaN film.

\* \* \* \* \*